United States Patent
Sakuma et al.

(10) Patent No.: US 6,411,384 B2
(45) Date of Patent: Jun. 25, 2002

(54) OPTICAL ELEMENT MADE FROM FLUORIDE SINGLE CRYSTAL, METHOD FOR MANUFACTURING OPTICAL ELEMENT, METHOD FOR CALCULATING BIREFRINGENCE OF OPTICAL ELEMENT AND METHOD FOR DETERMINING DIRECTION OF MINIMUM BIREFRINGENCE OF OPTICAL ELEMENT

(75) Inventors: Shigeru Sakuma, Chigasaki; Shuuichi Takano, Inagi, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/748,195

(22) Filed: Dec. 27, 2000

Related U.S. Application Data

(62) Division of application No. 09/265,893, filed on Mar. 11, 1999, now Pat. No. 6,201,634.

(30) Foreign Application Priority Data

| Mar. 12, 1998 | (JP) | 10-061779 |
| Apr. 9, 1998 | (JP) | 10-097973 |
| Oct. 16, 1998 | (JP) | 10-295554 |

(51) Int. Cl.$^7$ ............... G01J 4/00; G02F 1/00
(52) U.S. Cl. ........ 356/365; 359/322
(58) Field of Search ........... 356/364–369; 359/322, 323

(56) References Cited

U.S. PATENT DOCUMENTS 4,713,820 A  12/1987 Morris et al. ............ 37/41

6,201,634 B1 * 3/2001 Sakuma et al. ......... 359/322

OTHER PUBLICATIONS

Feldman, Albert et al., "Optical Materials Characterization Final Technical Report," NBS Technical Note 993, Feb. 1, 1978–Sep. 30, 1978, pp. 1–25; 56–63.

* cited by examiner

Primary Examiner—Frank G. Font
Assistant Examiner—Layla Lauchman
(74) Attorney, Agent, or Firm—Morgan, Lewis & Bockius LLP

(57) ABSTRACT

The present invention provides a method for calculating the birefringence of an optical element and selecting the direction of minimum birefringence in the optical element. The birefringence of the optical element is calculated by converting known piezo-optical constants in a specified three-dimensional orthogonal coordinate system for the optical material into piezo-optical constants in an arbitrary three-dimensional orthogonal coordinate system. The amount of change in the refractive index $\Delta n1$ of the optical material in a first direction and the amount of change in the refractive index $\Delta n2$ of the optical material in a second direction which is perpendicular to the first direction are calculated using a uniaxial stress that is applied to the optical material along the first direction. The amount of birefringence as seen from a third direction perpendicular to the first direction and the second direction is determined in the arbitrary three-dimensional orthogonal coordinate system by determining the difference between the amount of change in the refractive index $\Delta n1$ and the amount of change in the refractive index $\Delta n2$.

11 Claims, 4 Drawing Sheets

OPTICAL ELEMENT MADE FROM FLUORIDE SINGLE CRYSTAL, METHOD FOR MANUFACTURING OPTICAL ELEMENT, METHOD FOR CALCULATING BIREFRINGENCE OF OPTICAL ELEMENT AND METHOD FOR DETERMINING DIRECTION OF MINIMUM BIREFRINGENCE OF OPTICAL ELEMENT

This is a divisional of application Ser. No. 09/265,893 filed on Mar. 11, 1999 now Pat. No. 6,201,634.

BACKGROUND OF THE INVENTION

1. Field of the Invention

The present invention is directed to an optical element, the method of making the optical element, an optical system using the optical element for an optical apparatus (e.g., a camera, microscope, telescope or photolithographic apparatus such as a stepper, etc.), and a method for calculating the birefringence of the optical element.

2. Description of the Related Art

Calcium fluoride, strontium fluoride and barium fluoride, which are fluoride crystals (single crystals) used as optical element materials, have a low refractive index compared to ordinary optical glass, and also show little dispersion (wavelength dependence of the refractive index); accordingly, such materials are useful for color aberration correction in optical systems.

In particular, calcium fluoride is easy to obtain, and can be obtained even as large-caliber single crystals with a diameter of Φ 150 mm or greater.

Such fluoride crystals (single crystals) belong to the cubic crystal type, and are optically isotropic bodies. These materials are suitable as materials for optical elements such as lenses, etc. Fluoride crystals have long been widely used as materials of camera lenses, microscope lenses and telescope lenses, etc.

Birefringence is a phenomenon in which the refractive index varies according to the direction of polarization of the light or other electromagnetic waves. Ordinarily, this is expressed as the light path difference (called "retardation") that occurs when the light passes through a unit length of the substance in question, and is given in units of nm/cm.

Furthermore, as another method of expressing birefringence, this phenomenon is also sometimes expressed as the difference (n1−n2) between the refractive index n1 with respect to light having a certain direction of polarization and the refractive index n2 for light with a direction of polarization that is perpendicular to the above-mentioned direction of polarization.

Furthermore, the refractive index n0 in a state in which no external force is acting on the substance in question is affected by external forces so that the refractive index changes. In cases where this change is dependent on the direction of polarization, the amounts of change in the refractive index are expressed as Δn1 and Δn2, and the difference between these amounts of change, i.e., (Δn1−Δn2), is also sometimes called "birefringence".

In cases where birefringence is caused by strain, this birefringence is also commonly called "strain". Moreover, crystals with cubic crystal systems inherently lack birefringence, but may have birefringence as a result of the effects of electromagnetic fields and stress.

Specifically, in the case of the above-mentioned fluoride crystals (single crystals), birefringence is generated as a result of the effects of stress. For example, considerable birefringence is present in currently manufactured fluoride crystals as a result of thermal stress occurring in the manufacturing process. Furthermore, the value of this birefringence is at least about 5 nm/cm, and may commonly reach 10 nm/cm or greater in fluoride crystals with a diameter of Φ 100 mm or greater.

Accordingly, even if an attempt is made to minimize the aberration of an optical system using a fluoride crystal (single crystal), the birefringence of the fluoride crystal arising from the effects of stress is an impediment. As a result, satisfactory optical performance often cannot be obtained in the optical system.

Furthermore, if countermeasures such as an extreme lengthening of the annealing time in the fluoride crystal manufacturing process, etc., are adopted in order to reduce the birefringence of fluoride crystals (single crystals) used in optical elements or optical systems, delivery dates are delayed (i.e., the productivity drops), and costs are increased.

In recent years, there has been a rapid development of lithographic techniques for inscribing integrated circuit patterns on wafers. Demand for higher integration of integrated circuits continues to grow. In order to realize such higher integration, it is necessary to increase the resolving power of stepper projection lenses.

The resolving power of a projection lens is governed by the wavelength of the light used and the NA (numerical aperture) of the projection lens. The resolving power can be increased by shortening the wavelength of the light used or increasing the NA (increasing the caliber) of the projection lens.

First, shortening of the wavelength of the light used will be discussed. The wavelengths used in steppers have already advanced to the g line (wavelength: 436 nm) and i line (wavelength: 365 nm). In the future, when even shorter-wavelength KrF excimer laser light (wavelength: 248 nm) and ArF excimer laser light (wavelength: 193 nm), etc., come into use, the use of optical glass in optical systems will become virtually impossible from the standpoint of transmittance.

Accordingly, synthetic silica glass or calcium fluoride is commonly used as an optical element material in the optical systems of excimer laser steppers.

Next, increasing the caliber of such elements will be discussed. Here, it is not simply a question of better results with a larger caliber. In regard to the materials of optical elements used in the optical systems of excimer laser steppers, it is necessary that single crystals be used in the case of calcium fluoride.

Furthermore, as the performance of steppers has improved, there has recently been a demand for large-caliber calcium fluoride single crystals with a caliber of around Φ 120 mm to Φ 250 mm. Such calcium fluoride single crystals have a low refractive index compared to ordinary optical glass, and also show little dispersion (wavelength dependence of the refractive index). Accordingly, such materials are extremely effective in the correction of color aberration. Furthermore, such materials can easily be obtained in the marketplace, with large-caliber single crystals having a diameter of Φ 120 mm or greater also being obtainable.

Calcium fluoride single crystals which have such advantages have long been used as lens materials in cameras, microscopes and telescopes in addition to being used as optical materials in steppers.

Furthermore, single crystals of barium fluoride and strontium fluoride, which are fluoride single crystals other than calcium fluoride single crystals, belong to the same cubic crystal type, and have similar properties; accordingly, the uses of these crystals are also similar to those of calcium fluoride single crystals.

Such fluoride single crystals can be manufactured by a method known as the Bridgeman method, the Stockberger method, or the "pull-down" method.

Here, a method for manufacturing calcium fluoride single crystals by the Bridgeman method (one example) will be described.

In the case of calcium fluoride single crystals used in the ultraviolet or vacuum ultraviolet region, natural fluorite is not used as a raw material; instead, the general practice is to use high-purity raw materials manufactured by chemical synthesis.

The raw materials can be used "as is" in a powdered state. In such a case, however, the volume decrease upon melting is severe. Ordinarily, therefore, semi-molten raw materials or pulverized products of the same are used.

First, a crucible filled with the above-mentioned raw material is placed in a growth apparatus, and the interior of the growth apparatus is maintained at a vacuum of $10^{-3}$ to $10^{-4}$ Pa.

Next, the temperature inside the growth apparatus is elevated to a temperature above the melting point of calcium fluoride (1370° C. to 1450° C.) so that the raw material is melted. In this case, control by means of a constant power output or high-precision PID control is performed in order to suppress fluctuations in the temperature inside the growth apparatus over time.

In the crystal growth stage, the crucible is lowered at a speed of approximately 0.1 to 5 mm/h, so that crystallization is gradually caused to occur from the lower part of the crucible.

When crystallization has occurred up to the upper portion of the melt, crystal growth is completed, and a simple gradual cooling process is performed, with sudden cooling being avoided so that the grown crystal (ingot) does not crack. When the temperature inside the growth apparatus has dropped to room temperature, the apparatus is opened to the atmosphere, and the ingot is removed.

Ordinarily, a graphite crucible is used in this crystal growth, and a pencil-shaped ingot with a conical tip is manufactured. In this case, a single crystal can be formed by growing the crystal from the area of the tip end of the conical part positioned at the lower end of the crucible.

Furthermore, if necessary, there is also a technique in which the direction of crystal growth is controlled by placing a seed crystal in the above-mentioned tip end portion; however, if the diameter of the ingot exceeds $\Phi$ 120 mm, control of the orientation of crystal growth becomes extremely difficult.

Generally, in cases where a fluoride single crystal is manufactured by the Bridgeman method, it is considered that there is no preference in the direction of growth, so that the horizontal plane of the ingot is a random plane in each crystal growth process.

Since there are extremely large amounts of residual stress and strain in the ingot removed from the crucible, the ingot is subjected to a simple heat treatment "as is".

The fluorite single crystal ingot thus obtained is cut to an appropriate size according to the desired product. Here, the ingot is naturally cut horizontally (annular cut) in order to cut out a material for manufacturing a larger optical element (lens, etc.) from the ingot in accordance with the desired product. Then, the material thus cut out is subjected to a heat treatment in order to improve the quality of the material.

SUMMARY OF THE INVENTION

In view of the above circumstances, an object of the present invention is to provide a method for calculating the birefringence of an optical element and a method for determining the birefringence of an optical element that make it possible to select the direction of minimum birefringence in the optical element. A further object is to provide an optical element that has little birefringence. Yet another object of the invention is to provide a method of manufacturing the material used to make an optical element with reduced birefringence. Another object is to provide an optical system in which the aberration of the optical devices is small.

To achieve the objects and in accordance with the purpose of the invention, as embodied and broadly described herein, the invention includes the method of manufacturing an optical element, calculating the birefringence of the optical element and determining the direction of minimum birefringence of the optical element. The method includes cutting a material for manufacturing optical elements from a fluoride single crystal ingot obtained by crystal growth so that the {111} crystal planes are two parallel planes, after which the optical performance is improved by subjecting this material to a heat treatment.

The material for manufacturing optical elements can also be cut from a fluoride single crystal ingot which has been obtained by crystal growth and which has been subjected to a heat treatment, so that the {111} crystal planes are two parallel planes, after which the optical performance is improved by subjecting this material to a heat treatment.

The birefringence of the above-mentioned material for manufacturing optical elements is reduced from a value of 5 nm/cm or greater to a value of 3 nm/cm or less by means of the above-mentioned heat treatment.

The shape of the material for manufacturing optical elements cut from the above-mentioned ingot is a cylindrical shape with a diameter of $\Phi$ 120 mm or greater.

Preferably, the above-mentioned fluoride single crystal is a calcium fluoride or barium fluoride single crystal.

Furthermore, since single crystals of calcium fluoride and barium fluoride both cleave along the {111} crystal planes, splitting (cleavage) will occur along the {111} planes in cases where the ingot splits as a result of thermal strain, etc.

Moreover, even in the case of an ingot which shows no cleavage, cleavage will occur if the end portion is struck lightly with a chisel, etc.

If the ingot is cut using the cleaved planes (cleavage planes) as a reference, so that the surfaces of the ingot are parallel to these planes, a material for manufacturing optical elements can be obtained. In the material thus obtained, {111} crystal planes are two parallel planes.

In cases where an optical element (e.g., a stepper projection lens) is manufactured from a material for manufacturing optical elements consisting of a fluoride single crystal of the present invention which has {111} crystal planes as two parallel planes, and which has a birefringence of 3 nm/cm or less, and an attempt is made to minimize the aberration of an optical system using this optical element, the birefringence of the material does not present problems as in conventional methods. As a result, the number of optical elements that can be used in the above-mentioned optical system (i.e., the number of optical elements that can be manufactured from the material) can be increased.

The method of calculating the birefringence of the optical element in accordance with another aspect of the invention includes converting known piezo-optical or elasto-optical constants in a specified three-dimensional orthogonal coordinate system for an optical material into piezo-optical or elasto-optical constants in an arbitrary three-dimensional orthogonal coordinate system. The method further includes calculating the amount of change in the refractive index Δn1 of the optical material in a first direction along the direction of one coordinate axis of the above-mentioned arbitrary three-dimensional orthogonal coordinate system, and the amount of change in the refractive index Δn2 of the optical material in a second direction which is perpendicular to the first direction. The calculation uses a uniaxial stress or the strain corresponding to the uniaxial stress that is applied to the above-mentioned optical element or optical element material along the first direction, and the piezo-optical or elasto-optical constants in the arbitrary three-dimensional coordinate system. The method also includes determining the difference between the amount of change in the refractive index Δnl and the amount of change in the refractive index Δn2 to determine the amount of birefringence as seen from a third direction perpendicular to the first direction and the second direction.

Since birefringence arising from stress is closely associated with the amount of displacement (strain), the present invention contemplates that birefringence is also dependent on direction. This fact was confirmed by a careful calculation of physical tensors.

The direction of observation showing a minimum birefringence is found for the above-mentioned optical element or optical element material from the amounts of birefringence respectively determined in the above-mentioned arbitrary three-dimensional orthogonal coordinate system.

According to another aspect of the invention the optical element material can be worked so that the above-mentioned direction of observation showing a minimum birefringence is caused to substantially coincide with the direction of the optical axis.

The material of the optical element can be a fluoride crystal. The fluoride crystal can be selected from a group of materials including calcium fluoride, strontium fluoride or barium fluoride.

The direction of observation showing a minimum birefringence substantially coincides with the <111> axial direction of the fluoride crystal, or substantially coincides with a direction perpendicular to the {111} plane of the fluoride crystal.

The optical element can be constructed from a fluoride crystal with the direction of the optical axis substantially coinciding with the <111> axial direction of the fluoride crystal, or substantially coinciding with a direction perpendicular to the {111} plane of the fluoride crystal.

In accordance with another aspect of the invention, an optical system for an optical apparatus can be constructed by combining fluoride crystals with the same refractive index or different refractive indices, and in which the direction of the optical axis of the optical system either coincides or substantially coincides with the <111> axial direction of at least one of the fluoride crystals, or coincides or substantially coincides with a direction perpendicular to the {111} plane of the at least one fluoride crystal. Reference to a direction that coincides or substantially coincides can preferably encompass coincidence within approximately 5 degrees in angular deviation.

The direction of minimum birefringence in an optical element or optical element material can be selected, so that an optical system with little (minimal) aberration can be constructed by means of such optical elements, or so that an optical element with a small birefringence (in which the direction of the optical axis is set so that the birefringence is minimal) can be obtained from such an optical element material.

DESCRIPTION OF THE PREFERRED EMBODIMENT

Reference will now be made in detail to the present exemplary embodiment(s) of the invention. Crystals with cubic crystal systems such as fluoride crystals (single crystals) are generally optically isotropic bodies when not under stress, so that the refractive index is inherently the same for light passing through from all directions relative to the crystal axis. But the mechanical properties of such crystals show an anisotropy and a differing amount of light displacement under the same stress depending on the direction the light passes through the crystal.

The material for manufacturing optical elements (Φ 180×t 150 cylindrical shape) in accordance with an aspect of the present embodiment consists of a calcium fluoride single crystal. This material has {111} crystal planes as two parallel planes, and has a birefringence of 1 nm/cm or less.

Furthermore, the material for manufacturing optical elements in accordance with the present embodiment is obtained by cutting the material for manufacturing optical elements from a calcium fluoride single crystal ingot obtained by crystal growth, or from a calcium fluoride single crystal ingot obtained by crystal growth and further subjected to a heat treatment, so that {111} crystal planes are two parallel planes, and then subjecting this material to a heat treatment.

Figure 2:
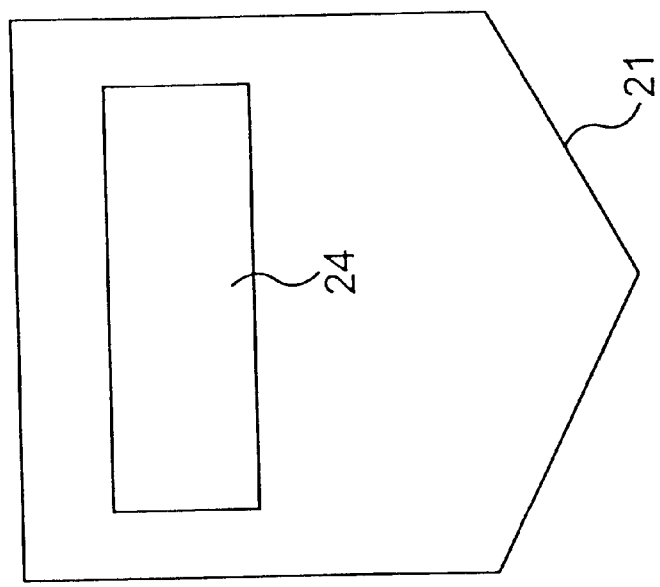
FIG. 2 is a schematic diagram which illustrates the acquisition of the material for manufacturing optical elements from an ingot.
Figure 2:
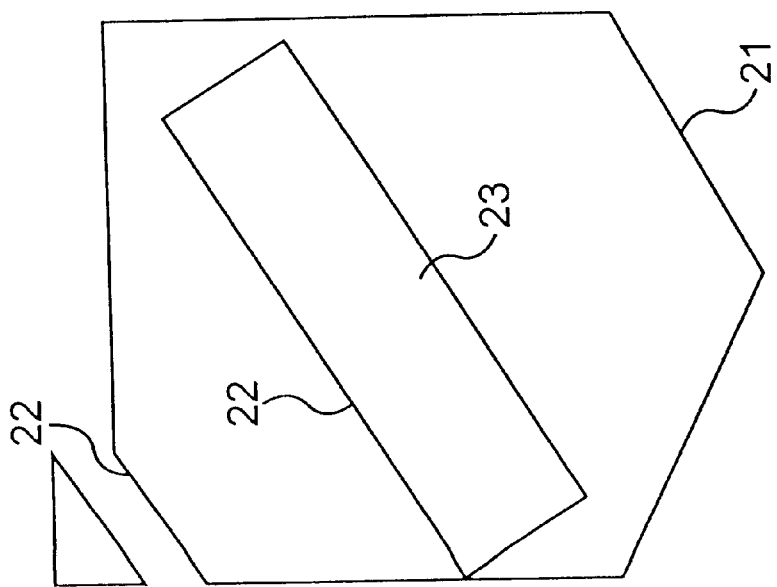

Referring to FIG. 2, one piece of material 23 for manufacturing optical elements involved in the present embodiment is cut from the ingot 21 with {111} crystal planes 22 being two parallel planes. Two material samples 24 with random surfaces in which the cut surfaces were not {111} crystal planes were also cut out of another ingot 21 for purposes of comparison (FIG. 2).

The birefringence values of the respective cut-out materials 23 and 24 were obtained by performing automatic measurements at approximately 200 points using an automatic birefringence measuring apparatus such as that manufactured by ORC MANUFACTURING CO., LTD.

Figure 1:
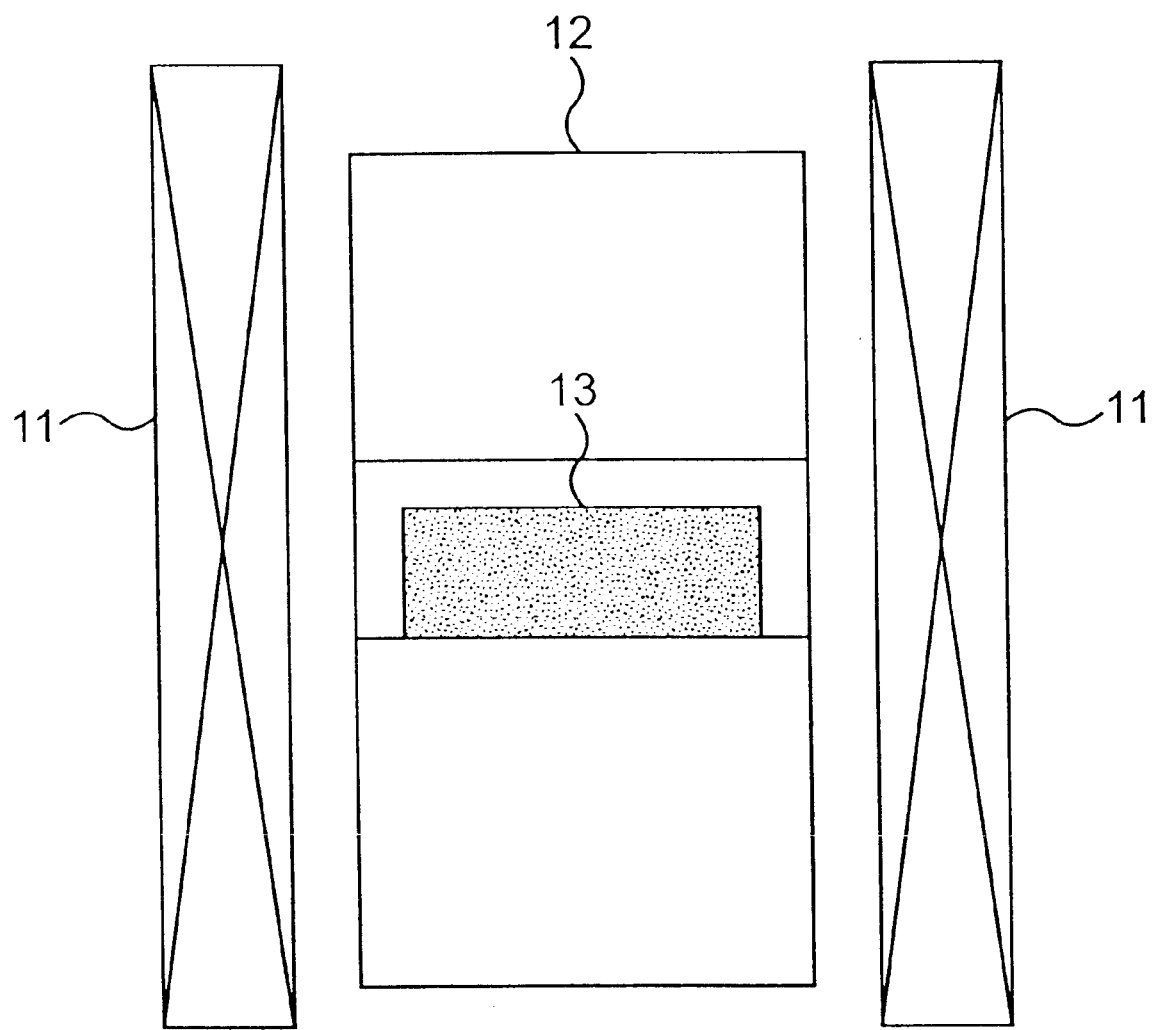
FIG. 1 is a schematic diagram which shows the conditions under which the material for manufacturing optical elements obtained from an ingot is heat-treated.

Next, the respective materials 23 and 24, shown at 13 in FIG. 1, were placed inside the vessel 12 of the heat treatment apparatus so that the planes of the materials were horizontal as shown in FIG. 1, and a heat treatment (annealing, heat treatment temperature: 1050° C.) was performed using the heating of a heater 11. Afterward, the birefringence values were again automatically measured in the same way.

As a result, maximum values of birefringence were obtained as shown in Table 1 before and after the heat treatment. It is seen from the measurement results in Table 1 that the birefringence values of the material 23 of the present embodiment, in which the cut surfaces were {111} planes, were much smaller than those of the random-plane materials 24 in which the cut surfaces were not {111} planes.

TABLE 1

Change in birefringence of calcium fluoride crystal described in Embodiment 1. Units: (nm/cm).

| Plane orientation | {111} | Random (1) | Random (2) |
|---|---|---|---|
| Birefringence before heat treatment | 12.4 | 11.8 | 9.2 |
| Birefringence after heat treatment | 0.8 | 3.2 | 4.9 |

Thus, by using the manufacturing method of the present embodiment, it is possible to obtain a material for manufacturing optical elements which consists of a calcium fluoride single crystal in which the birefringence value is reduced compared to conventional materials. In concrete terms, it was possible to obtain a material for manufacturing optical elements in which the birefringence was reduced to a value of 1 nm/cm or less.

Furthermore, in a case where a stepper projection lens was manufactured from a material consisting of a calcium fluoride single crystal obtained by the manufacturing method of the present embodiment, and an attempt was made to minimize the aberration of an optical system using this projection lens, the birefringence of the material was not a problem as in conventional methods. It was therefore possible to increase the number of projection lenses that could be used in the above-mentioned optical system (the number of projection lenses that could be manufactured from the material). Furthermore, it was possible to realize projection lenses with a superior optical performance.

In a second embodiment according to the invention, the material for manufacturing optical elements (Φ 180×t 50 cylindrical shape) consists of a barium fluoride single crystal. This material has {111} crystal planes as two parallel planes, and has a birefringence of 2 nm/cm or less.

Furthermore, the material for manufacturing optical elements involved in the second embodiment is obtained by cutting the material for manufacturing optical elements from a barium fluoride single crystal ingot obtained by crystal growth, or from a barium fluoride single crystal ingot obtained by crystal growth and further subjected to a heat treatment, so that {111} crystal planes are two parallel planes, and then subjecting this material to a heat treatment.

Similarly to the first embodiment, besides cutting out one material 23 for manufacturing optical elements involved in the present embodiment from the ingot 21 with {111} crystal planes 22 being two parallel planes, two material samples 24 with random surfaces in which the cut surfaces were not {111} crystal planes were cut out for purposes of comparison (FIG. 2).

Here, the birefringence values of the respective cut-out materials 23 and 24 were obtained by performing automatic measurements at approximately 200 points using an automatic birefringence measuring apparatus manufactured by ORC MANUFACTURING CO., LTD.

Next, the respective materials 23 and 24, as shown at 13 in FIG. 1, were placed inside the vessel 12 of the heat treatment apparatus so that the planes of the materials were horizontal as shown in FIG. 1, and a heat treatment (annealing, heat treatment temperature: 900° C.) was performed using the heating of a heater 11. Afterward, the birefringence values were again automatically measured in the same way.

As a result, maximum values of birefringence were obtained as shown in Table 2 before and after the heat treatment. It is seen from the measurement results in Table 2 that the birefringence values of the material 23 of the second embodiment, in which the cut surfaces were along {111} planes, were much smaller than those of the random-plane materials of the second embodiment in which the cut surfaces were not along {111} planes.

TABLE 2

Change in birefringence of barium fluoride crystal described in Embodiment 2. Units: (nm/cm).

| Plane orientation | {111} | Random (1) | Random (2) |
|---|---|---|---|
| Birefringence before heat treatment | 14.4 | 10.9 | 11.6 |
| Birefringence after heat treatment | 1.9 | 6.4 | 7.1 |

Thus, by using the manufacturing method of the second embodiment, it is possible to obtain a material for manufacturing optical elements which consists of a barium fluoride single crystal in which the birefringence value is reduced compared to conventional materials. In concrete terms, it was possible to obtain a material for manufacturing optical elements in which the birefringence was reduced to a value of 2 nm/cm or less.

Furthermore, in a case where a stepper projection lens was manufactured from a material consisting of a barium fluoride single crystal obtained by the manufacturing method of the second embodiment, and an attempt was made to minimize the aberration of an optical system using this projection lens, the birefringence of the material was not a problem as in conventional methods, and it was possible to increase the number of projection lenses that could be used in the above-mentioned optical system (the number of projection lenses that could be manufactured from the material). Furthermore, it was possible to realize projection lenses with a superior optical performance.

The following Equation (1) is an equation which expresses the refractive index ellipsoid of an object (e.g., an optical member such as an optical element or a material for the manufacture of optical elements, etc.) consisting of a fluoride single crystal.

$$B_{ij}\, x_i\, x_j = 1 \quad (i, j = 1, 2, 3) \tag{1}$$

Here, x1, x2 and x3 are coordinate axes which are respectively perpendicular to each other (i.e., the respective coordinate axes of a three-dimensional orthogonal coordinate system).

The coefficient $B_{ij}$ in Equation (1) varies according to the stress applied to the object; accordingly, the refractive index also varies. This amount of variation $\Delta B_{ij}$ is determined by the stress $\sigma_{kl}$ and tensors known as piezo-optical constants (piezo-optical coefficients: qijkl, see Equation (2)). Furthermore, for convenience of notation, Equation (2) is expressed as shown by Equation (3), with ijkl→ij.

$$\Delta Bij = qijkl\, \sigma kl \quad (2)$$

$$\Delta Bi = qij\, \sigma j \quad (3)$$

Furthermore, it is also possible to express this using strain tensors Ekl instead of stress tensors (see Equation (4)). Here, pijkl are referred to as elasto-optical constants (elasto-optical coefficients).

$$\Delta Bij = pijkl\, \epsilon kl \quad (4)$$

The piezo-optical constants of calcium fluoride ($CaF_2$), barium fluoride ($BaF_2$) and strontium fluoride ($SrF_2$) for several wavelengths are listed in NBS TECHNICAL NOTE 993 (1978).

Since the coordinate axes of these constants are taken on the axes of the crystal lattice, x1 may be taken on the [100] axis, x2 may be taken on the [010] axis, and x3 may be taken on the [001] axis (for example). Accordingly, if the above-mentioned piezo-optical constants and stress tensors are input into Equation (3), the amount of deformation of the refractive index ellipsoid can be calculated.

Specifically, if the measurement direction (direction of observation or light path) is determined, then the amount of birefringence is determined.

For example, assuming that the stress p applied to the object is a uniaxial stress along the [100] axis, then the stress tensors are as follows:

$$\sigma 1 = p,\ \sigma_2 = \sigma 3 = \sigma 4 = \sigma 5 = \sigma 6 = 0$$

$$\Delta B1 = q_{11}p,\ \Delta B2 = q_{12}p,\ \Delta B3 = q_{13}p,\ \ldots$$

Because of their symmetry, the piezo-optical constants of an equiaxial crystal system can be expressed as three constants; here, $q_{11}$, $q_{12}$ and $q_{44}$ are different constants. If these are written in tensor form, then the following equation is obtained:

Numerical Expression 1:

$$q_{ij} = \begin{bmatrix} q_{11} & q_{12} & q_{12} & 0 & 0 & 0 \\ q_{12} & q_{11} & q_{12} & 0 & 0 & 0 \\ q_{12} & q_{12} & q_{11} & 0 & 0 & 0 \\ 0 & 0 & 0 & q_{44} & 0 & 0 \\ 0 & 0 & 0 & 0 & q_{44} & 0 \\ 0 & 0 & 0 & 0 & 0 & q_{44} \end{bmatrix}$$

Here assuming that the measurement direction is the direction of the [001] axis, the birefringence is as follows:

$$\Delta n_{//} - \Delta n_{\perp} = 1/\sqrt{(\Delta B1)} - 1/\sqrt{(\Delta B2)} = -(\tfrac{1}{2})n^3(q_{11}-q_{12})p \quad (5)$$

In Equation (5), $\Delta n_{//}$ is the amount of variation in the refractive index with respect to light polarized in the direction of stress.

Equation (5) indicates that a larger birefringence will be generated under the same stress conditions in a substance (object) which has a larger coefficient ($q_{11}-q_{12}$).

If piezo-optical constants are copied from NBS TECHNICAL NOTE 993, the values obtained at a wavelength of 637.8 nm are shown in Table 1.

TABLE 1

| | Piezo-optical constants. | | | |
|---|---|---|---|---|
| | $CaF_2$ | $SrF_2$ | $BaF_2$ | |
| $q_{11}$ | −0.38 | −0.64 | −0.99 | |
| $q_{12}$ | 1.08 | 1.45 | 2.07 | |
| $q_{11} - q_{12}$ | −1.46 | −2.08 | −3.06 | |
| $q_{44}$ | 0.71 | 0.60 | 0.95 | (1E-12 Pa^-1) |

In this way, using the tensors of the uniaxial stress p applied to the optical element material along one coordinate axis (x1: [100] axis) of a three-dimensional (x1: [100] axis, x2: [010] axis, x3: [001] axis) orthogonal coordinate system, and the tensors of the above-mentioned known piezo-optical constants (in a specified three-dimensional orthogonal coordinate system x1, x2, x3), the amount of change in the refractive index $\Delta n1$ in the direction of the above-mentioned coordinate axis (first direction, direction of the [100] axis) and the amount of change in the refractive index $\Delta n2$ in a second direction (direction of the [010] axis) perpendicular to the direction of the above-mentioned coordinate axis are calculated, and the amount of birefringence seen from a third direction ([001] axis) which is perpendicular to the above-mentioned first and second directions is determined by determining the difference between the amount of change in the refractive index $\Delta n1$ and amount of change in the refractive index $\Delta n2$.

In an ordinary disk-shaped optical member (e.g., an optical element or material used for the manufacture of optical elements), cases are commonly encountered in which the optical axis of the optical system is oriented in the direction of the center axis of the disk, and the direction of stress is oriented toward the center of the disk perpendicular to the above-mentioned direction (or from the center toward the outside; this direction is ordinarily taken as positive, so that the sign of tensile stress is positive).

In order to calculate the birefringence for such a disk-shaped optical member in a case where stress is applied in an arbitrary direction, it is necessary to subject the above-mentioned known piezo-optical constants to a coordinate conversion.

Specifically, the above-mentioned known piezo-optical constants are optical constants in a specified three-dimensional (x1: [100] axis, x2: [010] axis, x3: [001] axis) orthogonal coordinate system, and are values for a case in which the coordinate axes are taken along the axes of the crystal lattice. The piezo-optical constants in an arbitrary three-dimensional orthogonal coordinate system corresponding to the arbitrary direction in which the above-mentioned stress is applied must be determined by subjecting the above-mentioned known piezo-optical constants to a coordinate conversion.

Figure 3:
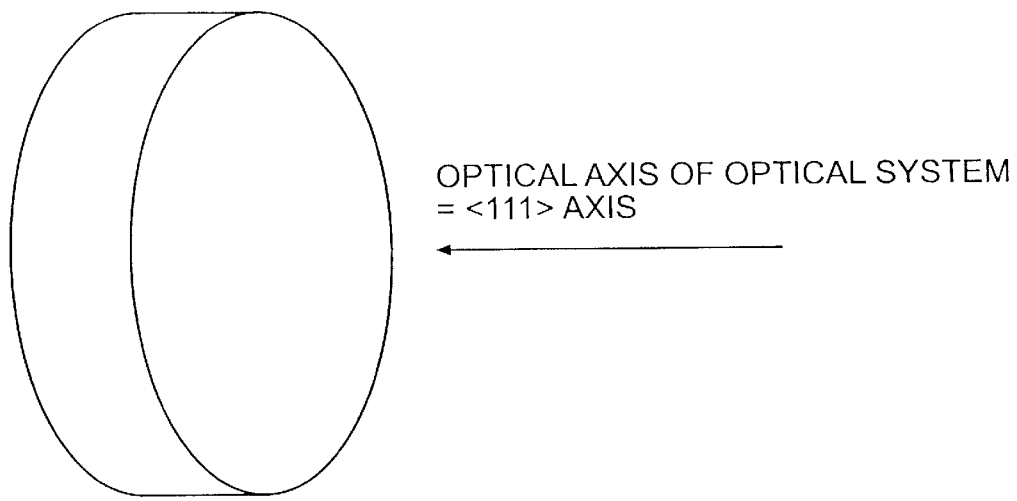
FIG. 3 is a conceptual diagram which shows coincidence (or substantial coincidence) of the direction of the optical axis of an optical system with the direction of the <111> axis of the fluoride crystal.
Figure 4:
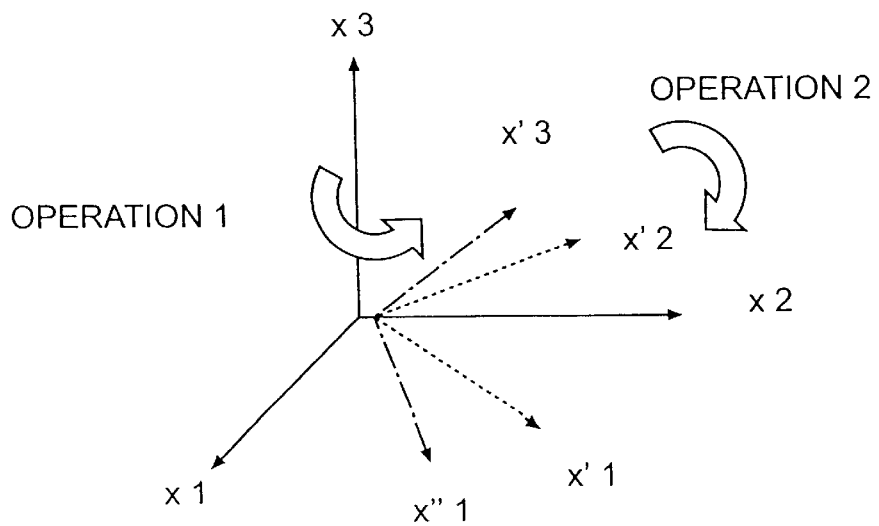
FIG. 4 is a conceptual diagram which shows the conditions of the coordinate conversion used in order to orient the x3 axis in a three-dimensional (x1: [100] axis, x2: [010] axis, x3: [001] axis) orthogonal coordinate system in the direction of the [111] axis.
Figure 5:
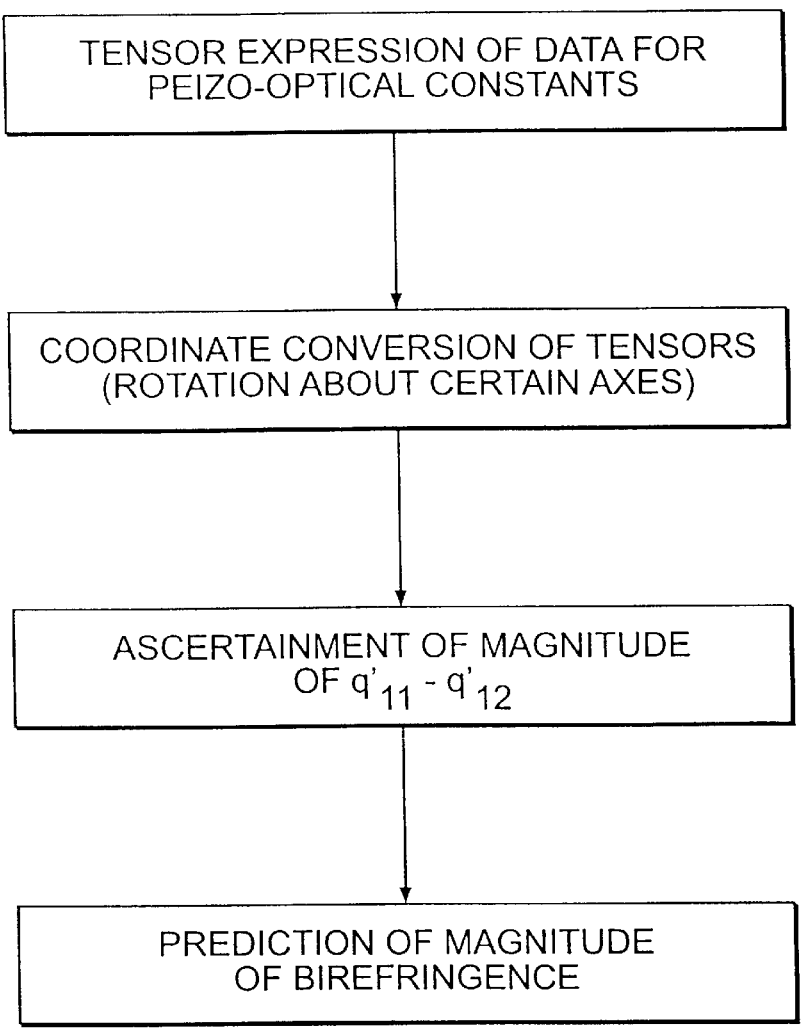
FIG. 5 is a flowchart of an algorithm used to predict the magnitude of birefringence.

Furthermore, using the uniaxial stress that is applied to the above-mentioned optical member along the direction of one coordinate axis of the above-mentioned arbitrary three-dimensional orthogonal coordinate system (first direction), and the piezo-optical constants in the above-mentioned arbitrary three-dimensional coordinate system, the amount of change in the refractive index $\Delta n1$ in the direction of one coordinate axis of the above-mentioned arbitrary three-dimensional orthogonal coordinate system (first direction), and the amount of change in the refractive index $\Delta n2$ in a second direction which is perpendicular to the direction of the above-mentioned coordinate axis, are calculated, and the amount of birefringence seen from a third direction perpendicular to the above-mentioned first and second directions can be determined in the above-mentioned arbitrary three-dimensional orthogonal coordinate system by determining the difference between the above-mentioned amounts (see FIG. 3).

As a result of the calculation of the respective birefringence values when the direction in which uniaxial stress is applied is taken to be an arbitrary direction, i.e., the respective birefringence values in an arbitrary three-dimensional orthogonal coordinate system, the birefringence measured from the direction of the <111> axis of the fluoride crystal constituting the optical member is determined to be the smallest.

The piezo-optical constants in a coordinate system in which the x3' axis of a three-dimensional (x1" axis, x2' axis, x3' axis) orthogonal coordinate system is oriented in the direction of the <111> axis were determined by subjecting the above-mentioned known piezo-optical constants to a coordinate conversion so that the x3 axis is oriented in the direction of the <111> axis.

Furthermore, the coordinate conversion of the piezo-optical constants can be accomplished by converting the respective components of the tensors in accordance with Equation (6) shown below. In order to accomplish this coordinate conversion, it is sufficient to perform rotations about the coordinate axes.

$$q'_{ijlk} = a_{im} a_{jn} a_{ko} a_{lp} q_{mnop} \quad (6)$$

$$a_{ij} = \begin{bmatrix} \cos(A) & \sin(A) & 0 \\ -\sin(A) & \cos(A) & 0 \\ 0 & 0 & 1 \end{bmatrix}$$

In the above equation, $a_{ij}$ is a tensor which performs the coordinate conversion, and indicates a case of rotation about the x3 axis by A radians in the counterclockwise direction.

For example, in order to orient the x3 axis in a three-dimensional (x1: [100] axis, x2: [010] axis, x3: [001] axis) orthogonal coordinate system in the direction of the [111] axis, it is sufficient first to cause a rotation of 45 degrees (in the counterclockwise direction) about the x3 axis, and then to cause a rotation of arctan (√2) in the clockwise direction about the x2' axis (FIG. 2).

Furthermore, in order to orient the x3 axis in a three-dimensional (x 1: [100] axis, x2: [010] axis, x3: [001] axis) orthogonal coordinate system in the direction of the [100] axis, it is sufficient to cause a rotation of 45 degrees (in the counterclockwise direction) about the x2 axis.

Furthermore, in order to orient the x3 axis in a three-dimensional (x1: [100] axis, x2: [010] axis, x3: [001] axis) orthogonal coordinate system in the direction of the [110] axis, it is sufficient first to cause a rotation of 90 degrees (in the counterclockwise direction) about the x2 axis and then to cause a rotation of 45 degrees (in the counterclockwise direction) about the x3 axis.

Here, a coordinate conversion for the purpose of orienting the x3 axis in a three-dimensional (x1: [100] axis, x2: [010] axis, x3: [001] axis) orthogonal coordinate system in the direction of the [111] axis will be performed, and the birefringence in a case where a stress p is applied from the direction of the x1" axis in the converted coordinate system (x1" axis, x2' axis, x3' axis) will be determined. The piezo-optical constant tensor $q'_{ij}$ in this case is expressed by the following equation:

Numerical Expression 3:

$$q'_{ij} = \begin{bmatrix} q'_{11} & q'_{12} & q'_{13} & 0 & q'_{15} & 0 \\ q'_{12} & q'_{11} & q'_{13} & 0 & -q'_{15} & 0 \\ q'_{13} & q'_{13} & q'_{33} & 0 & 0 & 0 \\ 0 & 0 & 0 & q'_{44} & 0 & 0 \\ q'_{15} & -q'_{15} & 0 & 0 & q'_{44} & 0 \\ 0 & 0 & 0 & 0 & 0 & q'_{66} \end{bmatrix}$$

Furthermore, $q'_{ij}$ calculated from the values in NBS TECHNICAL NOTE 993 is as shown in Table 2.

TABLE 2

| Coordinate-converted piezo-optical constants. | | | |
|---|---|---|---|
| | CaF$_2$ | SrF$_2$ | BaF$_2$ |
| q'$_{11}$ | 0.705 | 0.705 | 1.015 |
| q'$_{33}$ | 0.357 | 1.153 | 1.683 |
| q'$_{12}$ | 0.718 | 1.002 | 1.402 |
| q'$_{13}$ | 0.357 | 0.553 | 0.733 |
| q'$_{15}$ | −1.023 | −1.268 | −1.890 |
| q'$_{44}$ | −0.737 | −1.193 | −1.723 |
| q'$_{66}$ | −0.0133 | −0.297 | −0.387 |
| (q'$_{11}$ − q'$_{12}$) | −0.0133 | −0.297 | −0.387) |

If the birefringence in a case where a uniaxial stress $\sigma'_i$ is applied ($\sigma'1=p$, $\sigma'2=\sigma'3 \ldots =0$) is calculated using these values, then we obtain the following:

$$\Delta n_{//} - \Delta n_\perp = -(1/2) n^3 (q'_{11} - q'_{12}) p \quad (7)$$

Since the value of $q'_{11} - q'_{12} = q'_{66}$ is the smallest of all the coefficients, it is seen that the birefringence realizes a minimum value.

Specifically, it is seen from the calculated values in Table 2 that the birefringence in the direction of the <111> axis is smallest in calcium fluoride, strontium fluoride and barium fluoride.

In particular, the birefringence in the direction of the <111> axis in calcium fluoride is extremely small, and is smaller than the values seen in strontium fluoride and barium fluoride by about an order of magnitude.

Thus, in the present embodiment, it was possible to select the direction of minimum birefringence in the material of an optical member.

Furthermore, in the present embodiment, by selecting the direction of minimum birefringence in an optical member, it was possible to form an optical element with a small birefringence (in which the direction of the optical axis was set so that the birefringence showed a minimum value), or to manufacture an optical element with such a small birefringence from a material used for the manufacture of optical elements.

For example, in the present embodiment, an optical element was manufactured by finding the direction of observation in which the birefringence showed a minimum value (third direction) for the above-mentioned optical element material from the amounts of birefringence respectively determined in the above-mentioned arbitrary three-dimensional orthogonal coordinate system, and working the above-mentioned optical element material so that the direction of observation in which the birefringence showed a minimum value (i.e., the direction of the <111> axis of the fluoride crystal) coincided (or substantially coincided) with the direction of the optical axis. Here, reference to a direction which coincides (or substantially coincides) means that there is preferably a coincidence to within approximately 5 degrees in terms of angular deviation.

Furthermore, calcium fluoride, strontium fluoride and barium fluoride all have the property of cleaving along the (111) plane. The present invention is also very advantageous in terms of working, in that a material with a small birefringence can be created by working the material in parallel with this cleavage plane.

Furthermore, in the present embodiment, disk-form bodies with dimensions of Φ 150×20 were cut from respective blocks of calcium fluoride, strontium fluoride and barium fluoride, and were used as optical elements or precursors of optical elements (materials for manufacturing optical elements). Furthermore, the respective birefringence values were measured for three cases in which the Φ 150 center axis was [100], [110] or [111] (Table 3). Moreover, the above-mentioned blocks were manufactured by substantially comparable crystal growth and heat treatment.

Birefringence refers to the maximum birefringence value obtained when the surface of the optical element or precursor was polished, and measurements were made at approximately 100 points across an effective diameter of Φ 140 using an automatic measuring device such as that manufactured by ORC MANUFACTURING CO., LTD. Furthermore, values in parentheses are average values.

Moreover, lenses with a curvature can be obtained by working the above-mentioned precursor into the shape of a lens; in this case, it goes without saying that working is performed so that the direction of the <111> axis of the precursor coincides (or substantially coincides) with the direction of the optical axis.

TABLE 3

Measured values of birefringence for three types of fluoride crystals.

| Axial orientation | Plane orientation | $CaF_2$ | $SrF_2$ | $BaF_2$ | |
|---|---|---|---|---|---|
| [100] | (100) | 5.4 (3.8) | 8.4 (5.5) | 10.2 (5.8) | |
| [110] | (110) | 6.8 (3.5) | 7.3 (4.9) | 9.1 (5.2) | |
| [111] | (111) | 1.1 (0.4) | 2.5 (1.0) | 2.9 (1.3) | [nm/cm] |

Thus, in the present embodiment, it was possible to obtain an optical element with a small birefringence (i.e., with the direction of the optical axis set so that the birefringence showed a minimum value), in which the direction of the optical axis either coincided (or substantially coincided) with the <111> axial direction of the fluoride crystal, or coincided (or substantially coincided) with a direction perpendicular to the {111} plane of the fluoride crystal.

In the present embodiment, the amounts of birefringence are determined in an arbitrary three-dimensional orthogonal coordinate system using the uniaxial stress (tensor) applied to the optical member and the piezo-optical constants (tensors) in the arbitrary three-dimensional coordinate system. However, these could also be determined using the strain (tensor) corresponding to the above-mentioned uniaxial stress and the elasto-optical constants (tensors) in the arbitrary three-dimensional coordinate system.

What is claimed is:

1. A method for calculating the birefringence of an optical element or optical element material, comprising at least:

converting known piezo-optical constants in a specified three-dimensional orthogonal coordinate system for an optical material into piezo-optical constants in an arbitrary three-dimensional orthogonal coordinate system;

calculating Δn1 and Δn2 which respectively are an amount of change in refractive index of the optical material in a first direction along a direction of one coordinate axis of the arbitrary three-dimensional orthogonal coordinate system and an amount of change in refractive index of the optical material in a second direction which is perpendicular to the first direction by using a uniaxial stress that is applied to the optical material along the first direction and said piezo-optical constants in the arbitrary three-dimensional coordinate system; and determining a difference between the amount of change in the refractive index Δn1 and the amount of change in the refractive index Δn2 to determine an amount of birefringence as seen from a third direction perpendicular to the first direction and the second direction.

2. A method for calculating the birefringence of an optical element or optical element material, comprising at least:

converting known elasto-optical constants in a specified three-dimensional orthogonal coordinate system for an optical material into elasto-optical constants in an arbitrary three-dimensional orthogonal coordinate system;

calculating Δn1 and Δn2 which respectively are an amount of change in refractive index of the optical material in a first direction along a direction of one coordinate axis of the arbitrary three-dimensional orthogonal coordinate system and an amount of change in refractive index of the optical material in a second direction which is perpendicular to the first direction by using a strain corresponding to a uniaxial stress that is applied to the optical material along the first direction and said elasto-optical constants in the arbitrary three-dimensional coordinate system; and determining a difference between the amount of change in the refractive index An1 and the amount of change in the refractive index Δn2 to determine an amount of birefringence as seen from a third direction perpendicular to the first direction and the second direction.

3. A method for determining the direction of minimum birefringence of an optical element or optical element material, comprising at least:

converting known piezo-optical constants in a specified three-dimensional orthogonal coordinate system for an optical material into piezo-optical constants in an arbitrary three-dimensional orthogonal coordinate system;

calculating Δn1 and Δn2 which respectively are an amount of change in refractive index of the optical material in a first direction along a direction of one coordinate axis of the arbitrary three-dimensional orthogonal coordinate system and an amount of change in refractive index of the optical material in a second direction which is perpendicular to the first direction by using uniaxial stress that is applied to the optical material along the first direction and said piezo-optical constants in the arbitrary three-dimensional coordinate system;

determining a difference between the amount of change in the refractive index An1 and the amount of change in the refractive index Δn2 to determine an amount of birefringence as seen from a third direction perpendicular to the first direction and the second direction; and finding a direction of observation showing a minimum birefringence for the optical material from the amounts of birefringence respectively determined in the arbitrary three-dimensional orthogonal coordinate system.

4. A method for determining the direction of minimum birefringence of an optical element or optical element material, comprising at least:

converting known elasto-optical constants in a specified three-dimensional orthogonal coordinate system for an optical material into elasto-optical constants in an arbitrary three-dimensional orthogonal coordinate system;

calculating $\Delta n1$ and $\Delta n2$ which respectively are an amount of change in refractive index of the optical material in a first direction along a direction of one coordinate axis of the arbitrary three-dimensional orthogonal coordinate system and an amount of change in refractive index of the optical material in a second direction which is perpendicular to the first direction by using a strain corresponding to a uniaxial stress that is applied to the optical material along the first direction and said elasto-optical constants in the arbitrary three-dimensional coordinate system;

determining a difference between the amount of change in the refractive index $\Delta n1$ and the amount of change in the refractive index $\Delta n2$ to determine an amount of birefringence as seen from a third direction perpendicular to the first direction and the second direction; and finding a direction of observation showing a minimum birefringence for the optical material from the amounts of birefringence respectively determined in the arbitrary three-dimensional orthogonal coordinate system.

5. A method for manufacturing an optical element comprising at least:

converting known piezo-optical constants in a specified three-dimensional orthogonal coordinate system for an optical material into piezo-optical constants in an arbitrary three-dimensional orthogonal coordinate system;

calculating $\Delta n1$ and $\Delta n2$ which respectively are an amount of change in refractive index of the optical material in a first direction along a direction of one coordinate axis of the arbitrary three-dimensional orthogonal coordinate system and an amount of change in refractive index of the optical material in a second direction which is perpendicular to the first direction by using a uniaxial stress that is applied to the optical material along the first direction and said piezo-optical constants in the arbitrary three-dimensional coordinate system;

determining a difference between the amount of change in the refractive index $\Delta n1$ and the amount of change in the refractive index $\Delta n2$ to determine an amount of birefringence as seen from a third direction perpendicular to the first direction and the second direction;

finding a direction of observation showing a minimum birefringence for the optical material from the amounts of birefringence respectively determined in the arbitrary three-dimensional orthogonal coordinate system; and processing the optical material so that the direction of observation showing a minimum birefringence is caused to substantially coincides with a direction of an optical axis of the optical element.

6. A method for manufacturing an optical element comprising at least:

converting known elasto-optical constants in a specified three-dimensional orthogonal coordinate system for an optical material into elasto-optical constants in an arbitrary three-dimensional orthogonal coordinate system;

calculating $\Delta n1$ and $\Delta n2$ which respectively are an amount of change in refractive index of the optical material in a first direction along a direction of one coordinate axis of the arbitrary three-dimensional orthogonal coordinate system and an amount of change in refractive index of the optical material in a second direction which is perpendicular to the first direction by using a uniaxial stress that is applied to the optical material along the first direction and said elasto-optical constants in the arbitrary three-dimensional coordinate system;

determining a difference between the amount of change in the refractive index $\Delta n1$ and the amount of change in the refractive index $\Delta n2$ to determine an amount of birefringence as seen from a third direction perpendicular to the first direction and the second direction;

finding a direction of observation showing a minimum birefringence for the optical material from the amounts of birefringence respectively determined in the arbitrary three-dimensional orthogonal coordinate system; and processing the optical material so that the direction of observation showing a minimum birefringence is caused to substantially coincides with a direction of an optical axis of the optical element.

7. The method according to claim 1, wherein the optical material is a fluoride crystal.

8. The method according to claim 7, wherein the fluoride crystal is selected from the group consisting of calcium fluoride, strontium fluoride and barium fluoride.

9. The method according to claim 8, wherein the direction of observation showing a minimum birefringence substantially coincides with the <111> axial direction of the fluoride crystal, or substantially coincides with a direction perpendicular to the {111} plane of the fluoride crystal.

10. The method according to claim 7, wherein the fluoride crystal is cut from a fluoride single crystal ingot obtained by crystal growth so that the {111} crystal planes are two parallel planes, after which the optical performance is improved by subjecting the crystal to a heat treatment.

11. The method in accordance with claim 10, wherein the birefringence of the crystal is reduced from a value of 5 nm/cm or greater to a value of 3 nm/cm or less by means of the above-mentioned heat treatment.

* * * * *